United States Patent
Da Fonseca et al.

(10) Patent No.: US 11,139,830 B2
(45) Date of Patent: Oct. 5, 2021

(54) BIT INVERSION FOR DATA TRANSMISSION

(71) Applicant: QUALCOMM Incorporated, San Diego, CA (US)

(72) Inventors: Fernand Da Fonseca, San Diego, CA (US); Tarek Zghal, San Diego, CA (US); Richard Gerard Hofmann, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 32 days.

(21) Appl. No.: 16/774,472

(22) Filed: Jan. 28, 2020

(65) Prior Publication Data

US 2021/0234554 A1 Jul. 29, 2021

(51) Int. Cl.
*H03M 13/09* (2006.01)
*G06F 13/20* (2006.01)
*H03M 13/29* (2006.01)

(52) U.S. Cl.
CPC ............ *H03M 13/09* (2013.01); *G06F 13/20* (2013.01); *H03M 13/2942* (2013.01)

(58) Field of Classification Search
CPC .................................................. H03M 13/09
USPC ........................................ 714/801, 807, 800
See application file for complete search history.

(56) References Cited

U.S. PATENT DOCUMENTS

| | | | |
|---|---|---|---|
| 2003/0125015 A1* | 7/2003 | Inoue | H04L 9/0662 455/411 |
| 2009/0110109 A1 | 4/2009 | Skerlj | |
| 2009/0147882 A1* | 6/2009 | Rha | H04L 25/4915 375/295 |
| 2015/0019921 A1* | 1/2015 | Chen | G06F 11/10 714/701 |
| 2016/0162434 A1 | 6/2016 | Mozak et al. | |
| 2017/0039001 A1* | 2/2017 | Tailliet | G11C 16/10 |
| 2017/0353195 A1* | 12/2017 | Goel | G06F 11/1068 |
| 2020/0028708 A1* | 1/2020 | Wilson | H04L 12/40032 |

FOREIGN PATENT DOCUMENTS

WO WO-2006027742 A1 3/2006

OTHER PUBLICATIONS

International Search Report and Written Opinion—PCT/US2021/015206—ISA/EPO—dated Apr. 28, 2021.

* cited by examiner

*Primary Examiner* — Fritz Alphonse
(74) *Attorney, Agent, or Firm* — Qualcomm Incorporated

(57) ABSTRACT

In certain aspects, a method for sending data over a bus comprises: calculating a parity check code for a new data code, wherein the new data code comprises a number of bits in the new data code; calculating a Hamming distance between the new data code and a prior data code; and if the Hamming distance is greater than half of the number of bits in the new data code: inverting the new data code and the parity check code to obtain an inverted new data code and an inverted parity check code; and sending the inverted new data code and the inverted parity check code to the bus.

30 Claims, 6 Drawing Sheets

BIT INVERSION FOR DATA TRANSMISSION

BACKGROUND

Field

Aspects of the present disclosure relate to data transmission, and more particularly, to data transmission across a bus using bit inversion.

Background

Data transmission is the process of sending and receiving digital information over a communication medium to one or more computing, network, or electronic components. It enables the transfer and communication of components in a point-to-point, point-to-multipoint and multipoint-to-multipoint environment. The sending and receiving components may reside in the same die, same package, same PCB board, or same system and connected through physical wires. As the computing capability becomes more powerful, the bandwidth for data transmission grows rapidly. The growth of the bandwidth has been fueled not only by faster circuitry, higher frequency clocking, but also by more robust design and more communication channels.

The high-speed and high bandwidth communication channel often comes at a cost of more area for more communication channels to accommodate the expanded communication demand. More communication channels, in turn, increases the power consumption. Both are undesired for a high performance and low power system, particularly for mobile or wireless devices, where battery time and device size are critical parameters. Therefore, it is beneficial to reduce wire connection count while maintaining reliable, high-speed, and high bandwidth data transmission.

SUMMARY

The following presents a simplified summary of one or more implementations to provide a basic understanding of such implementations. This summary is not an extensive overview of all contemplated implementations, and is intended to neither identify key nor critical elements of all implementations nor delineate the scope of any or all implementations. The sole purpose of the summary is to present concepts relate to one or more implementations in a simplified form as a prelude to a more detailed description that is presented later.

In one aspect, a method for sending data over a bus comprises: calculating a parity check code for a new data code, wherein the new data code comprises a number of bits in the new data code; calculating a Hamming distance between the new data code and a prior data code; and if the Hamming distance is greater than half of the number of bits in the new data code: inverting the new data code and the parity check code to obtain an inverted new data code and an inverted parity check code; and sending the inverted new data code and the inverted parity check code to the bus.

In another aspect, a method for receiving data over a bus comprises: receiving a received data code and a received parity check code of a first type of parity check from the bus, wherein the first type of parity check is either an even parity check or an odd parity check; calculating a calculated parity check code of a second type of parity check for the received data code, wherein the second type of parity check is an odd parity check if the first type of parity check is an even parity check or an even parity check if the first type of parity check is an odd parity check; and providing the inverted received data code for further processing if the calculated parity check code of the second type of parity check for the received data code matches with the received parity check code, wherein the inverted received data code is obtained by inverting the received data code.

In yet another aspect, a system comprises a bus; and a sender coupled to the bus and configured to: calculate a parity check code for a new data code, wherein the new data code comprises a number of bits in the new data code; calculate a Hamming distance between the new data code and a prior data code; and if the Hamming distance is greater than half of the number of bits in the new data code: invert the new data code and the parity check code to obtain an inverted new data code and an inverted parity check code; and send the inverted new data code and the inverted parity check code to the bus.

In yet another aspect, a system comprises a bus; and a receiver coupled to the bus and configured to: receive a received data code and a received parity check code of a first type of parity check from the bus, wherein the first type of parity check is either an even parity check or an odd parity check; calculate a calculated parity check code of a second type of parity check for the received data code, wherein the second type of parity check is an odd parity check if the first type of parity check is an even parity check or an even parity check if the first type of parity check is an odd parity check; and provide the inverted received data code for further processing if the calculated parity check code of the second type of parity check for the received data code matches with the received parity check code, wherein the inverted received data code is obtained by inverting the received data code.

To accomplish the foregoing and related ends, one or more implementations include the features hereinafter fully described and particularly pointed out in the claims. The following description and the annexed drawings set forth in detail certain illustrative aspects of the one or more implementations. These aspects are indicative, however, of a few of the various ways in which the principles of various implementations may be employed and the described implementations are intended to include all such aspects and their equivalents.

DETAILED DESCRIPTION

The detailed description set forth below, in connection with the appended drawings, is intended as a description of various aspects and is not intended to represent the only aspects in which the concepts described herein may be practiced. The detailed description includes specific details for the purpose of providing an understanding of the various concepts. However, it will be apparent to those skilled in the art that these concepts may be practiced without these specific details. In some instances, well-known structures and components are shown in block diagram form in order to avoid obscuring such concepts.

For high-speed high bandwidth data transmission, performance, power consumption, reliability are all key metrics. Error checking is often employed to improve the reliability. A parity check is the process that ensures accurate data transmission between components during communication. A parity code is appended to the original data bits to create an even or odd bit number, the number of bits with value one. The source then transmits the data with appended parity code via a link, and the combination of data with appended parity code bits are checked and verified at the destination. Data is considered accurate if the combined number of asserted bits (even or odd) matches the number transmitted from the source.

In addition to error checking, bus inversion is a technique often employed to minimize toggling for power saving. It is based on the fact that a large amount of power is wasted because of transitions, especially in external buses, and thus reducing these transitions aids optimization of power dissipation. For example, bus inversion limits the maximum switching of the data to 50% of the bits. This minimizes peak power dissipation by the same amount. Bus inversion is conventionally done by introducing an additional signal line to the bus lines. The additional signal line, Invert, indicates whether the other lines have been inverted or not. First, the Hamming distance (the number of bits in which they differ) between the new data code and the prior data code is computed. If the Hamming distance is larger than half of the total bits, the new data code is made equal to the inverted new data code before sending and Invert could be set to 1 to signal the receiver that the data transmitted has been inverted. Otherwise, Invert is set to 0 and the new data code is sent without inversion.

Figure 1:
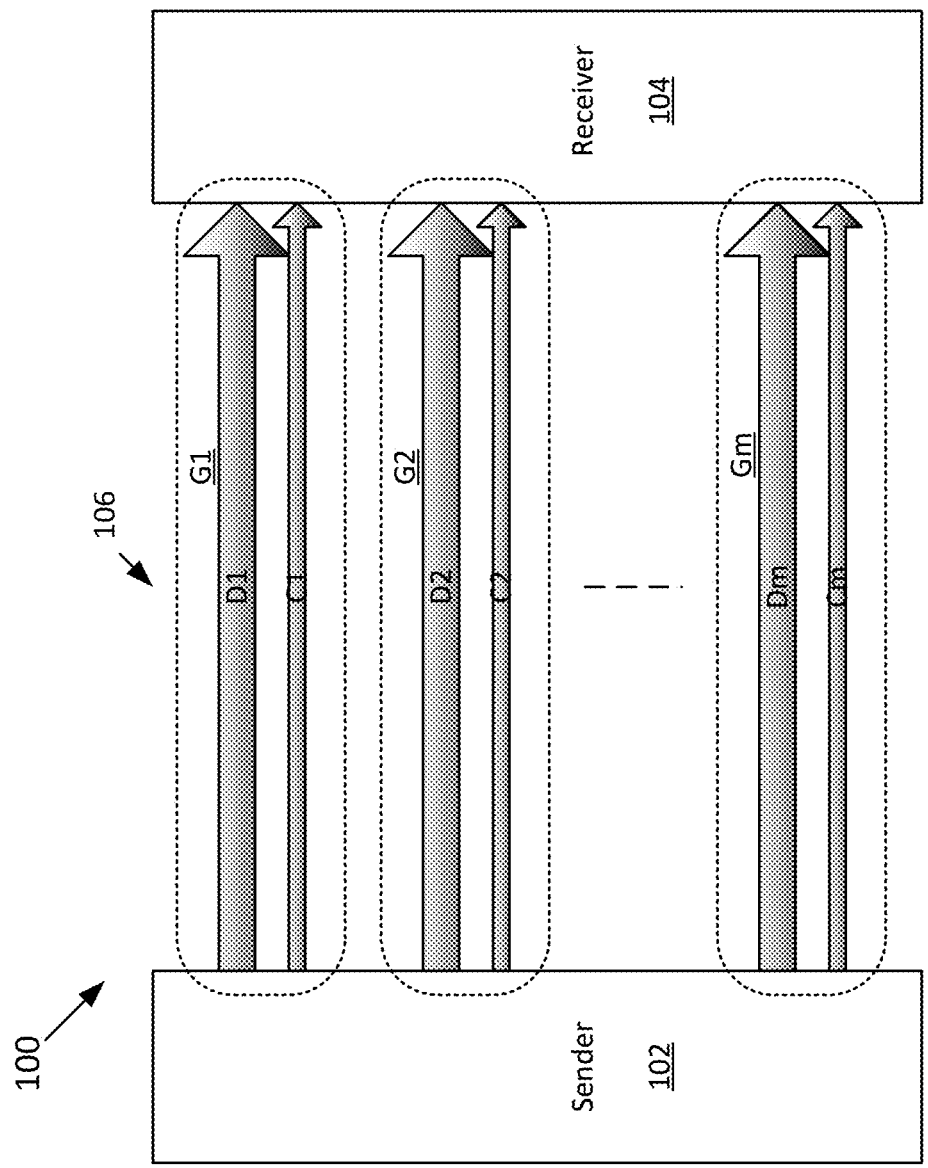
FIG. 1 illustrates an exemplary bus grouping according to certain aspects of the present disclosure.

To speed up the Hamming distance calculation and to reduce power consumption, the bus is divided into a plurality of groups. FIG. 1 illustrates an exemplary bus grouping according to certain aspects of the present disclosure. The data bus system 100 comprises a sender 102 and a receiver 104. The sender 102 sends data over a bus 106 to the receiver 104. In some configuration, the bus may be bi-directional. The sender 102 may function as a receiver and the receiver 104 may function as a sender. The bus 106 comprises a group of physical wires. The bus 106 is divided into a plurality of groups, G1, G2, . . . , Gm. Each group comprises a plurality of data lines and one or more error check lines. The plurality of data lines corresponds to the number of bits in the data code of the group and the number of error check lines corresponds to the number of bits in the error check code. The data code in each group is a portion of a large data code to be sent over the entire bus 106. For example, group G1 comprises a plurality of data lines D1 and one or more error check lines C1; group G2 comprises a plurality of data lines D2 and one or more error check lines C2; . . . ; group Gm comprises a plurality of data lines Dm and one or more error check lines Cm; The error check code calculation and Hamming distance calculation are confined within each group. Each group usually has the same number of data lines and error check lines in the bus 106. With fewer number of bits to traverse in each group and calculation of all groups done in parallel, circuit complexity, power consumption, and time for obtaining the error check code and Hamming distance are significantly reduced.

As an example, assume the data bus 106 is to transfer a large data of 1024 bits and parity check is applied. To calculate parity and/or Hamming distance for all 1024 bits as one code takes complex circuitry, plurality of clock cycles, and significant power consumption, which may be intolerable. To improve the performance and to reduce power consumption, the large data is divided into 16 groups, each group is a subset of the large data. In this example, each group has 64 bits, requiring 64 wire lines. In addition, each group may have one or more parity check lines requiring additional parity check wire lines. If additional signal line, Invert, is added to each group to signal if the data code in the group has been inverted, then additional 16 wire lines are needed. That is significant area overhead on top of significant power consumption for transmitting information over those lines. Therefore, it is beneficial to have a system that reliably transmits data over the bus without incurring the additional wires for inversion signaling.

Figure 2:
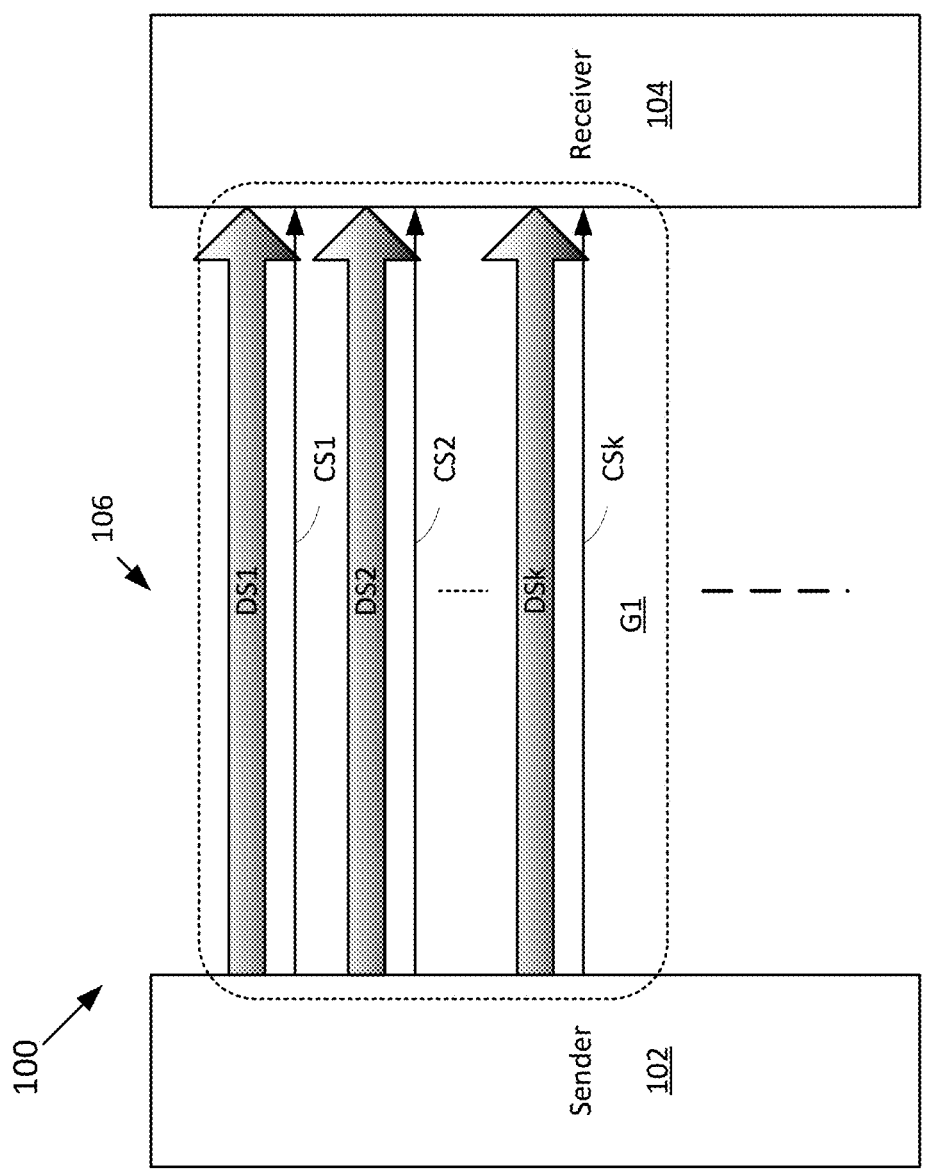
FIG. 2 illustrates an exemplary parity check grouping according to certain aspects of the present disclosure

FIG. 2 illustrates an exemplary parity check grouping according to certain aspects of the present disclosure. Within each group G1, G2, . . . , Gm in FIG. 1, further grouping is done for parity check. For illustration purpose, group G1 is used as an example. Other groups G2, . . . , Gm may follow same grouping scheme. In group G1, the plurality of data lines D1 is further divided into a plurality of sub-groups DS1, DS2, . . . , DSk. Similarly the error check lines of group G1 are divided into a plurality of parity check lines CS1, CS2, . . . , CSk, each for a corresponding one of the plurality of sub-groups DS1, DS2, . . . , DSk. For example, for a 64-bit data line group, it could be further divided into 8 sub-groups, each has 8 data lines plus 1 parity check line.

Figure 3:
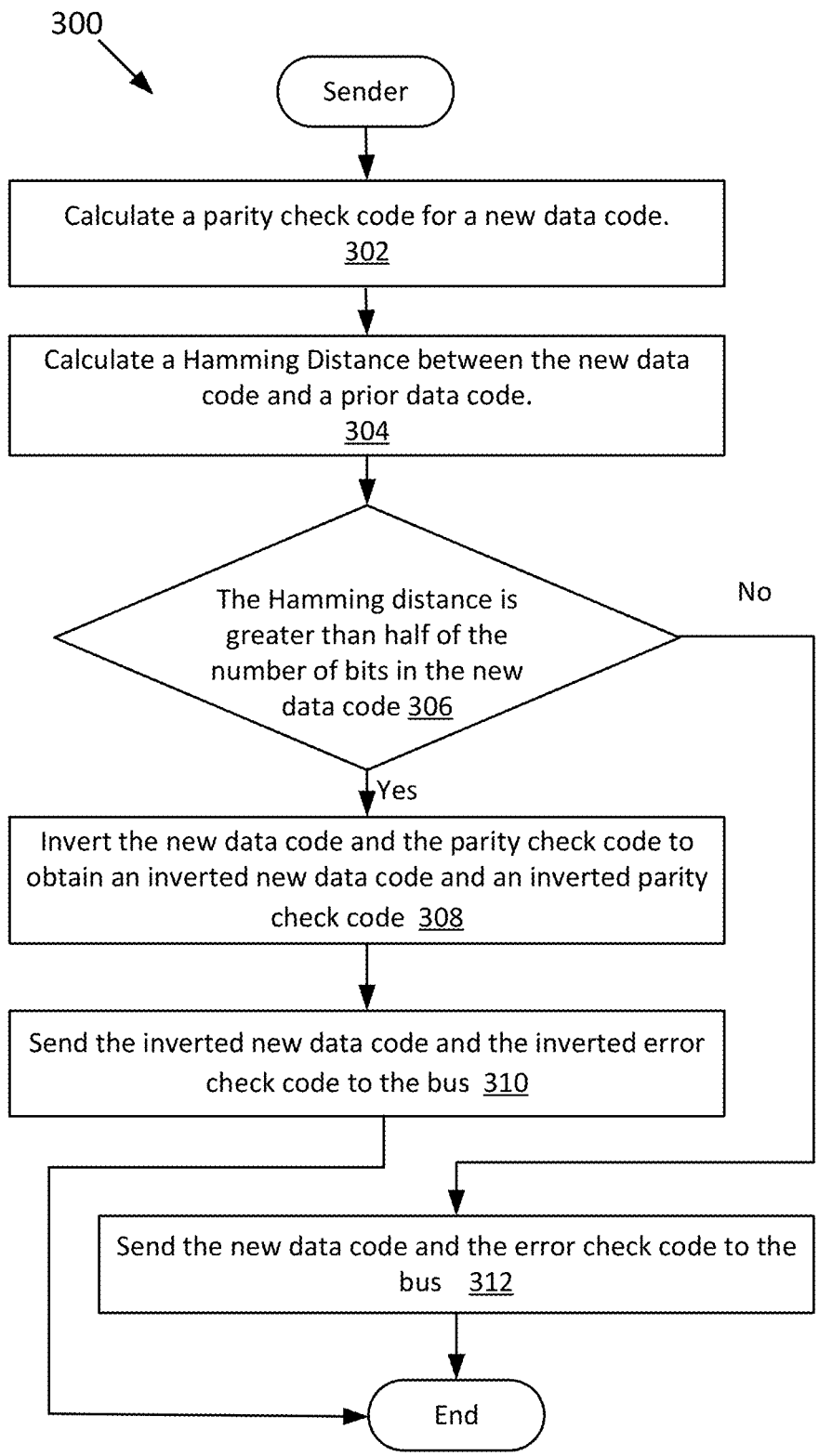
FIG. 3 illustrates an exemplary method for sending data without additional wires for inversion signaling according to certain aspects of the present disclosure.

FIG. 3 illustrates an exemplary method for sending data without additional wires for inversion signaling according to certain aspects of the present disclosure. The method 300 is executed by a sender (e.g., the sender 102). The method 300 works for a bus with one or more groups, each group being divided into a plurality of sub-groups, each one of the plurality of sub-group contains one parity check line. For illustration purpose, only one group data transmission is described. The method is equally applied to other groups if there are any. At 302, for each group, a new data code of the group is sent over a plurality of data lines in a portion of the bus. The sender calculates a parity check code (even or odd, depending on pre-selected error check scheme) for the new data code. The new data code is divided into a plurality of sub-groups. The sender calculates a parity bit for each one of the plurality of sub-group. The parity check code is an error check code which contains all the parity bits of the new data code. In specific implementation, the parity bits do not have to be sent through wires next to each other.

Further, at 304, the sender calculates a Hamming distance between the new data code of the group and a prior data code of the group. The prior data code of the group is the last data code sent before sending the new data code of the group over the same data lines in the same portion of the bus.

The value of the prior data code of the group determines the current state of each data line in the bus. At 306, the Hamming distance for the group is checked to determine if it is greater than half of the number of bits in the new data code of the group. If it is, the sender takes action at 308. The sender inverts the new data code of the group and the parity check code to obtain an inverted new data code and an inverted parity check codes. By inversion, each bit of data code or parity check code is changed from logic "1" to "0"

or logic "0" to "1". Then at 310, the sender sends the inverted new data code and the inverted error check code to the bus. If the Hamming distance is less than or equal to half of the number of bits in the new data code, then no inversion is needed. As a result, at 312, the sender sends the new data code and the error check code to the bus directly.

Figure 4:
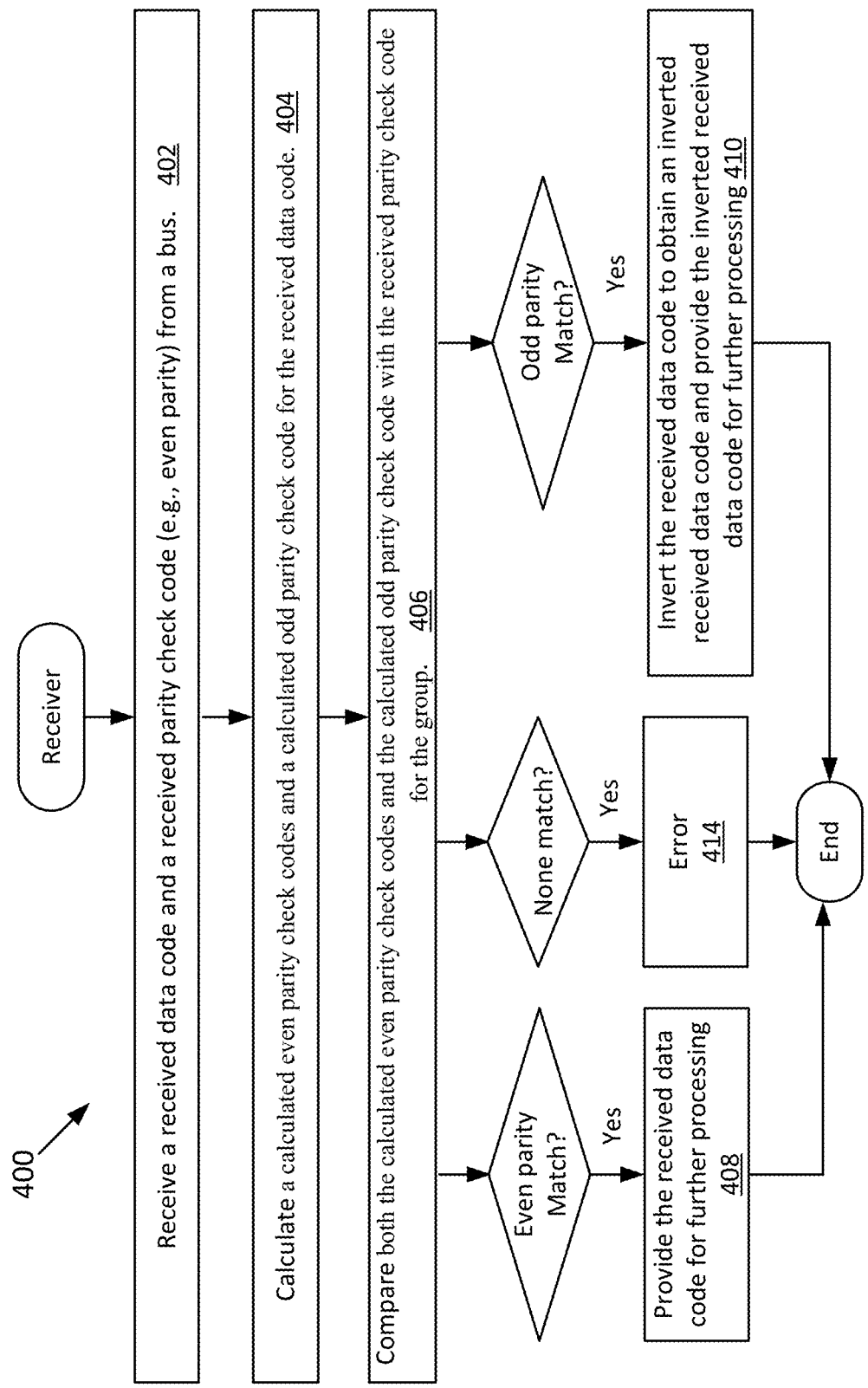
FIG. 4 illustrates an exemplary method for receiving data without additional wires for inversion signaling according to certain aspects of the present disclosure.

FIG. 4 illustrates an exemplary method for receiving data without additional wires for inversion signaling according to certain aspects of the present disclosure. The method 400 is executed by a receiver (e.g., the receiver 104). For illustration purpose, only one group of data received is described below. If there is more than one group, same method applies to other groups.

At 402, the receiver receives a data from a sender sent by the method 300 over a bus. The data may be divided into a plurality of groups. Each group comprises a received data code and a received parity check code. The received data code and the received error check code are the new data code and the error check code of the group, respectively, in the method 300 if the Hamming distance is not greater than half of the number of bits in the data. Otherwise, the received data code and the received error check code are the inverted new data code and the inverted error check code, respectively, in the method 300.

The method 400 applies for error check being parity check. There are two types of the parity check: if a first type is an even parity check, then the second type is an odd parity check, and vice versa. For illustration purpose only, in the following description, the even parity check is used by the sender. The received error check code is an even parity code. For odd parity used by the sender, same method applies by switching even parity to odd parity and odd parity to even parity. At 404, the receiver calculates a calculated even parity check codes and a calculated odd parity check code for the received data code. The receiver divides the received data code into a plurality of sub-groups according to the same grouping scheme in the sender. The receiver than calculates an even parity bit and an odd parity for each one of the plurality of sub-groups of the received data code. The calculated even parity check code is an error check code which contains all the even parity bits of the received data code. Likewise, the calculated odd parity check code is an error check code which contains all the odd parity bits of the received data code.

Then at 406, the receiver compares both the calculated even parity check codes and the calculated odd parity check code with the received parity check code for the group. If the calculated even parity check code matches, which is the parity used by the sender in this example, then it indicates that the received data code is non-inverted and valid. The received data code is ready to be provided for further processing, which is done at 408. However, if the calculated odd parity check code matches, then it indicates that the received data code is inverted and is valid. Therefore, the method goes to 410, where the received data code is inverted to obtain an inverted received data code and the inverted received data code is provided for further processing. If there is no match, neither even nor odd parity, then the received data code must be corrupted during transmission, an error signal should be generated at 414.

In an alternative embodiment, the receiver may not have to calculate and/or match the calculated odd parity check code if it finds that even parity matches, saving power and time. Alternatively, the receiver may perform the odd parity check first and may not have to calculate and/or match the calculated even parity check code if it finds that odd parity matches.

The methods 300 and 400 do not require inversion signal lines. This is possible as in the side of sending, the error check code is inverted together with the data code if the Hamming distance is greater than half of the number of bits in the data code. In the side of receiving, inversion and corruption of data code is checked through two comparisons: comparison between the calculated even parity check code for the received data code and the received error check code and comparison between the calculated odd parity check code for the received data code and the received error check code. The scheme significantly saves wiring cost. Adding wires is costly. It contributes to power dissipation and routing area. For a bus with 1024-bit data code and 64-bit grouping, area for 16 wires are saved in addition to power consumption for toggling the signals on those wires.

Figure 5:
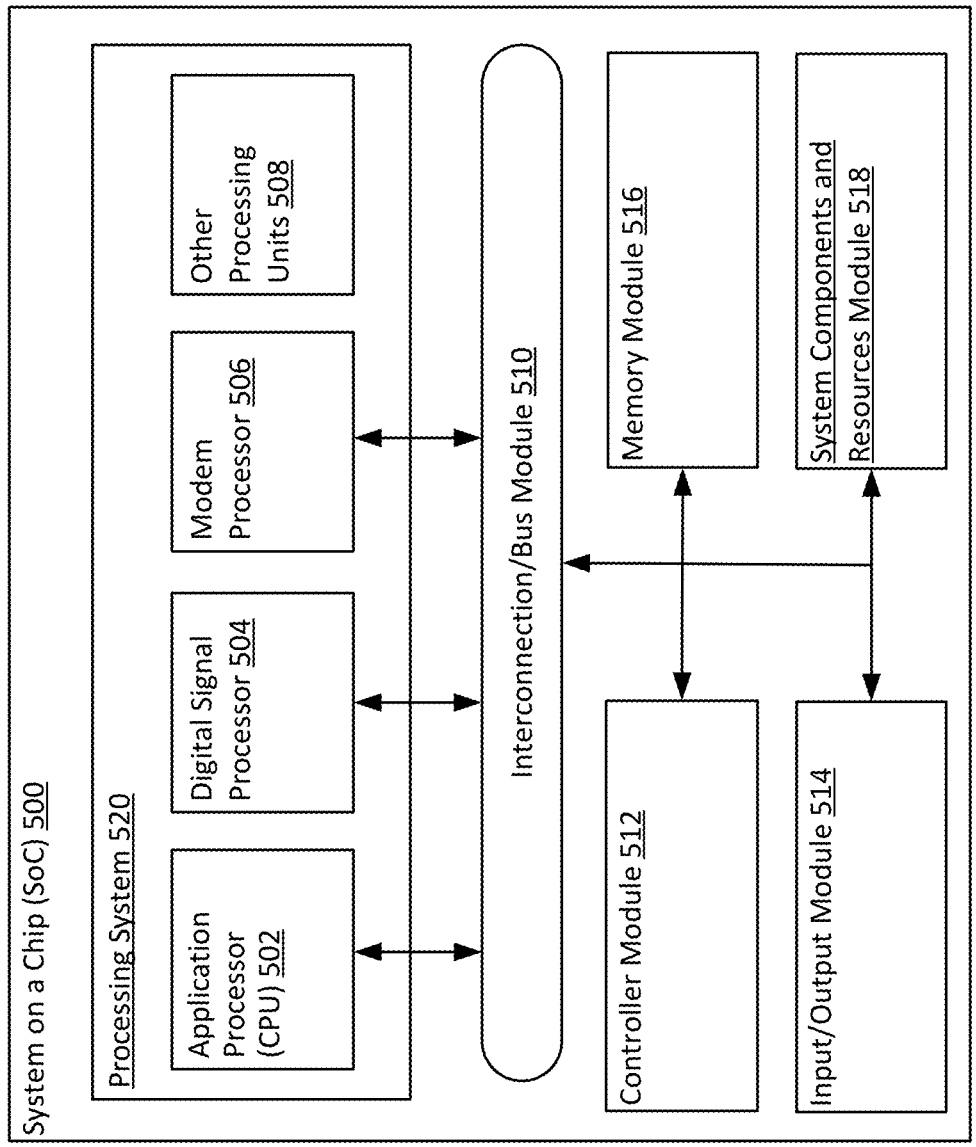
FIG. 5 illustrates an exemplary system-on-chip (SoC) implementing the data transmission without additional wires for inversion signaling according to certain aspects of the present disclosure.

FIG. 5 illustrates an exemplary system-on-chip (SoC) 500 implementing the data transmission without additional wires for inversion signaling according to certain aspects of the present disclosure. The data transmission without additional wires for inversion signaling may be implemented inside the SoC 500. The SoC 500 comprises a processing system 520 that includes a plurality of heterogeneous processors such as an application processor 502, a digital signal processor 504, a modem processor 506, and other processing units 508. The processing system 520 may include one or more cores, and each processor/core may perform operations independent of the other processors/cores.

The processing system 520 is interconnected with one or more controller module 512, input/output (I/O) module 514, memory module 516, and system components and resources module 418 via an interconnection/bus module 510, which may include an array of reconfigurable logic gates and/or implement bus architecture (e.g., CoreConnect, advanced microcontroller bus architecture (AMBA), etc.). The interconnection/bus module 510 communications may be provided by advanced interconnects, such as high performance networks-on-chip (NoCs). The interconnection/bus module 510 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 510 may implement an arbitration scheme to prevent multiple master components from attempting to drive the bus simultaneously. The interconnection/bus module 510 may comprise a plurality of buses for connecting varied components within the SoC 500.

The memory module 516 is a computer-readable storage medium implemented in the SoC 500. The memory module 516 may provide non-volatile storage, such as flash memory, for one or more of the processing system 520, controller module 512, I/O module 514, and/or the system components and resources module 518. The memory module 516 may include a cache memory to provide temporary storage of information to enhance processing speed of the SoC 500. In some examples, the memory module 516 may be implemented as a universal flash storage (UFS) integrated into the SoC 500, or an external UFS card.

The interconnection/bus module 510 facilitates the data transmission among the components within the SoC 500. For example, the processors within the processing system 520 may transmit data between each other through the interconnect/bus module 510. The application processor 502 and the modem processor 506 may pass data to each other through a bus. The processors within the processing system 520 may transmit data to and from the memory module 516. The processors within the processing system 520 may transmit data to and from the input/output module 514. The memory module 516 may transmit data to and from the input/output module 514. The methods 200 and 300 may be applied to those data transmissions. With the methods 200 and 300, the interconnect/bus module 510 would be more compact and does not have to dedicate valuable power and area resource for inversion signaling. The methods 200 and 300 may be, for example, implemented as a firmware where executable instructions reside in the memory module 516 and executed by the one or more components in the processing system 520. Alternatively, the method 200 and 300 may be implemented as a state machine residing in one or more components of SoC 500.

Figure 6:
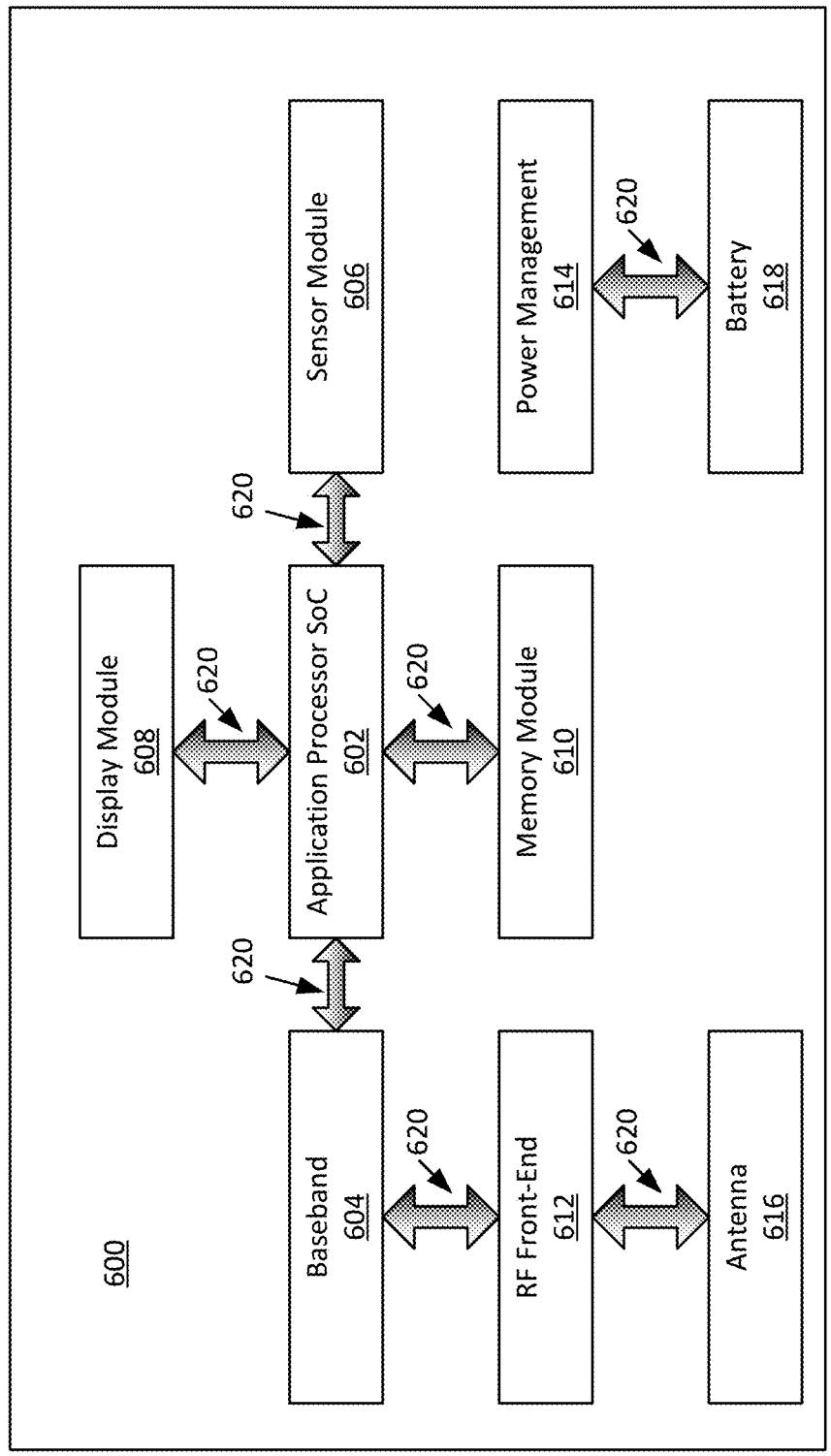
FIG. 6 illustrates an exemplary system implementing the data transmission without additional wires for inversion signaling according to certain aspects of the present disclosure.

FIG. 6 illustrates an exemplary system implementing the data transmission without additional wires for inversion signaling according to certain aspects of the present disclosure. The system 600 may be, for example, a wireless device, an IoT device, or a computing device. The system 600 may comprise a plurality of components, such as an application processor SoC 602, a baseband 604, a sensor module 606, a display module 608, a memory module 610, a RF front-end 612, a power management 614, an antenna 616, and/or a battery 618, and may include more. The plurality of components may communicate to each other through a plurality of interconnection/buses 620, where data are transmitted. In some configurations, the plurality of interconnection/buses 620 may be different from each other, such as have different number of wire lines, different number of voltages, different error checks, or they may be the same. Some or all of transmission over the plurality interconnection/buses 620 may be implemented with the methods 300 and 400. For example, the transmission between the application processor SoC 602 with the display module 608 or between the baseband 604 and the application processor SoC 602 may use the methods 300 and 400.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for sending data over a bus, comprising:
   calculating a parity check code for a new data code, wherein the new data code comprises a number of bits in the new data code;
   calculating a Hamming distance between the new data code and a prior data code; and
   if the Hamming distance is greater than half of the number of bits in the new data code:
      inverting the new data code and the parity check code to obtain an inverted new data code and an inverted parity check code; and sending the inverted new data code and the inverted parity check code to the bus.

2. The method of claim 1 further comprising sending the new data code and the parity check code to the bus if the Hamming distance is not greater than half of the number of bits in the new data code.

3. The method of claim 1, wherein calculating the parity check code for the new data code comprises calculating a parity bit for each of a plurality of sub-groups of the new data code and wherein the parity check code is an error check code which contains all the parity bits of the new data code.

4. The method of claim 1 wherein the new data code is a subset of a large data code.

5. The method of claim 1, wherein the parity check code is an even parity code.

6. The method of claim 1, wherein the bus does not include a wire for inversion signaling.

7. A method for receiving data over a bus, comprising:
receiving a received data code and a received parity check code of a first type of parity check from the bus, wherein the first type of parity check is either an even parity check or an odd parity check;
calculating a calculated parity check code of a second type of parity check for the received data code, wherein the second type of parity check is an odd parity check if the first type of parity check is an even parity check or an even parity check if the first type of parity check is an odd parity check; and
providing the inverted received data code for further processing if the calculated parity check code of the second type of parity check for the received data code matches with the received parity check code, wherein the inverted received data code is obtained by inverting the received data code.

8. The method of claim 7 further comprising:
calculating a calculated parity check code of the first type of parity check for the received data code; and
providing the received data code for further processing if the calculated parity check code of the first type of parity check for the received data code matches with the received parity check code.

9. The method of claim 8 further comprising sending an error signal if the calculated parity check code of the first type of parity check for the received data code does not match with the received parity check code and the calculated parity check code of the second type of parity check for the received data code does not match with the received parity check code.

10. The method of claim 7 wherein calculating the calculated parity check code of the second type of parity check for the received data code comprises calculating a parity bit for each of a plurality of sub-groups of the received data code and wherein the calculated parity check code of the second type of parity check for the received data code is an error check code which contains all the parity bits of the received data code.

11. The method of claim 7 wherein the bus does not include a wire for inversion signaling.

12. A system, comprising
a bus; and
a sender coupled to the bus and configured to:
calculate a parity check code for a new data code, wherein the new data code comprises a number of bits in the new data code;
calculate a Hamming distance between the new data code and a prior data code; and
if the Hamming distance is greater than half of the number of bits in the new data code:
invert the new data code and the parity check code to obtain an inverted new data code and an inverted parity check code; and
send the inverted new data code and the inverted parity check code to the bus.

13. The system of claim 12, wherein the sender is further configured to send the new data code and the parity check code to the bus if the Hamming distance is not greater than half of the number of bits in the new data code.

14. The system of claim 12, wherein the sender is a processor.

15. The system of claim 12, wherein the sender and the bus are integrated into a system-on-chip.

16. The system of claim 12, wherein the bus does not include a wire for inversion signaling.

17. The system of claim 12 further comprising a receiver coupled to the bus and configured to:
receive a received data code and a received parity check code of a first type of parity check from the bus, wherein the first type of parity check is either an even parity check or an odd parity check;
calculate a calculated parity check code of a second type of parity check for the received data code, wherein the second type of parity check is an odd parity check if the first type of parity check is an even parity check or an even parity check if the first type of parity check is an odd parity check; and
provide the inverted received data code for further processing if the calculated parity check code of the second type of parity check for the received data code matches with the received parity check code, wherein the inverted received data code is obtained by inverting the received data code.

18. The system of claim 17, wherein the received data code is the new data code.

19. The system of claim 17, wherein the received data code is the inverted new data code.

20. The system of claim 17, wherein the parity check code for the new data code is of the first type of parity check.

21. The system of claim 20, wherein the first type of parity check is an even parity check.

22. The system of claim 17, wherein the receiver is a memory or a processor.

23. The system of claim 17, wherein the sender, the receiver, and the bus are integrated into a system-on-chip.

24. The system of claim 17, wherein the sender, the receiver, and the bus are integrated into a wireless device.

25. A system, comprising:
a bus; and
a receiver coupled to the bus and configured to:
receive a received data code and a received parity check code of a first type of parity check from the bus, wherein the first type of parity check is either an even parity check or an odd parity check;
calculate a calculated parity check code of a second type of parity check for the received data code, wherein the second type of parity check is an odd parity check if the first type of parity check is an even parity check or an even parity check if the first type of parity check is an odd parity check; and
provide the inverted received data code for further processing if the calculated parity check code of the second type of parity check for the received data code matches with the received parity check code, wherein the inverted received data code is obtained by inverting the received data code.

26. The system of claim 25, wherein the receiver is further configured to
calculate a calculated parity check code of the first type of parity check for the received data code; and
provide the received data code for further processing if the calculated parity check code of the first type of parity check for the received data code matches with the received parity check code.

27. The system of claim 26, wherein the receiver is further configured to provide an error signal if the calculated parity check code of the first type of parity check for the received data code does not match with the received parity check code and the calculated parity check code of the second type of parity check for the received data code does not match with the received parity check code.

28. The system of claim 25 further comprising a sender coupled to the bus and configured to send the received data code and the received error check code to the bus.

29. The system of claim 28, wherein the sender and the receiver reside in a wireless device.

30. The system of claim 25, wherein the bus does not include a wire for inversion signaling.

* * * * *